United States Patent [19]

Tamura

[11] 4,002,501
[45] Jan. 11, 1977

[54] HIGH SPEED, HIGH YIELD CMOS/SOS PROCESS

[75] Inventor: Ronald K. Tamura, Buena Park, Calif.

[73] Assignee: Rockwell International Corporation, El Segundo, Calif.

[22] Filed: June 16, 1975

[21] Appl. No.: 587,465

[52] U.S. Cl. .................. 148/1.5; 148/174; 148/175; 148/176; 148/188; 357/42; 357/91
[51] Int. Cl.² ...................... H01L 21/265
[58] Field of Search ........... 148/1.5, 174, 175, 176, 148/188; 357/42, 91

[56] References Cited

UNITED STATES PATENTS

| | | | |
|---|---|---|---|
| 3,461,361 | 8/1969 | Delivorias | 148/1.5 X |
| 3,484,662 | 12/1969 | Hagon | 148/176 X |
| 3,636,418 | 1/1972 | Burns et al. | 357/42 |
| 3,745,072 | 7/1973 | Scott, Jr. | 148/174 |
| 3,749,614 | 7/1973 | Boleky et al. | 148/188 |
| 3,796,929 | 3/1974 | Nicholas et al. | 148/1.5 X |

*Primary Examiner*—C. Lovell
*Assistant Examiner*—J. M. Davis
*Attorney, Agent, or Firm*—H. Fredrick Hamann; G. Donald Weber, Jr.; Robert Ochis

[57] ABSTRACT

A process for producing complementary metal-oxide-semiconductor/silicon-on-sapphire (CMOS/SOS) devices wherein undesirable effects of phosphorous on sapphire are avoided.

7 Claims, 22 Drawing Figures

FIG. 22 ns a CMOS/SOS process. The invention relates to a process for producing CMOS/SOS devices.

HIGH SPEED, HIGH YIELD CMOS/SOS PROCESS

BACKGROUND OF THE INVENTION

1. Field of the Invention

This invention relates to semiconductor processes and more particularly to a high speed, high yield CMOS/SOS process for production of CMOS/SOS devices.

2. Description of the Prior Art

As the semiconductor industry moves into faster operations, lower cost utilizations, it becomes imperative that better processes and better materials or combinations thereof be provided. One of the improved utilization of materials is the use of sapphire as a substrate. In using sapphire substrates a new technology referred to as silicon-on-sapphire (SOS) has been developed. In addition, it has been established that complementary metal-oxide-semiconductors (CMOS) have distinct advantages. That is, opposite conductivity type devices can be established in a single unit during essentially a single process.

It has been further established that a combination of these two technologies to produce CMOS/SOS devices would incorporate the advantages of each of the concepts together.

The elusive factor, however, has been to establish a CMOS/SOS process for use in production applications which would yield low resistance n-type silicon regions where desired, while providing high yield and high speed production.

In attempting to provide the low resistance n-type regions, it has been determined that it is desirable to use a phosphorous furnace deposition to provide n-type doping of the silicon. However, undesirable interactions occur between the phosphorous and the sapphire which result in the formation of an intermediate phosphorous-sapphire compound. This compound is undesirable insofar as it lifts off the surface of the sapphire and deposits over the rest of the wafer in such a manner that it cannot be readily removed. Also, a possible phosphorous-rich layer exists on the sapphire throughout the remainder of the processing. Also, erosion of the sapphire results which is especially harmful adjacent the p-type islands wherein the compound causes an undercutting and therefore a counter doping of the thermally oxidized p-type islands.

Moreover, during the furnace deposition of phosphorous, it has been determined that there is a likelihood of phosphorous penetration through the thermal oxide which has been grown over the p-type islands. This penetration occurs through the portion of the oxide nearest the sapphire where the oxide is the thinnest due to the limited amount of silicon available for formation of thermal oxide. Again, this penetration by the phosphorous causes counter doping of the p-type islands near the sapphire interface.

SUMMARY OF THE INVENTION

There is described a new CMOS/SOS process which permits the fabrication of CMOS/SOS devices with high speed, high yield and high reliability for production applications.

BRIEF DESCRIPTION OF PREFERRED EMBODIMENTS

Similar reference numerals refer to similar elements throughout the description and in the accompanying drawings.

As will become apparent, the basic process of the invention provides CMOS/SOS devices. In some instances, it is desirable to include diodes along with the other devices. This situation is defined as Process A. With only minor changes in the process, the diodes are omitted as defined in Process B. Nevertheless, it is clear that the same basic process is involved.

PROCESS A

Figure 1:
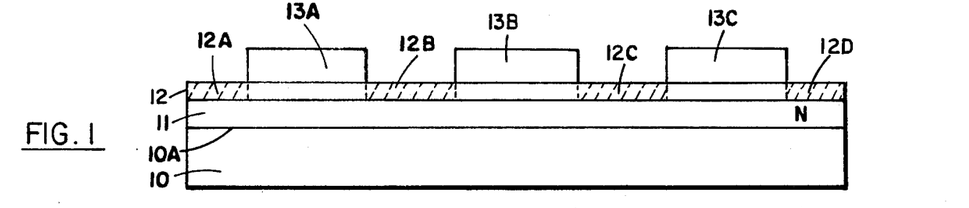
FIGS. 1–11 are schematic representations of CMOS/SOS devices prepared in accordance with one embodiment of the process of the instant invention.

Referring now to FIG. 1, there is shown a composite structure comprising a substrate 10 which is, typically, comprised of sapphire. On the major surface 10A of sapphire substrate 10 there is provided layer 11 of semiconductor material such as silicon. Typically, layer 11 is N type silicon. Layer 11 may be formed on substrate 10 in any suitable manner although epitaxial growth is a preferred process. The composite comprising substrate 10 and layer 11 is considered to be the basic structure or wafer from which composites are made in accordance with the process of the instant invention.

Initially, the basic wafer is subjected to a suitable cleaning process. A typical cleaning process includes the application to the wafer of a nitric acid bath for approximately 10 minutes at 65° C. The wafer is then immersed in deionized water for 10 minutes. A further application of sulfuric acid for 10 minutes at 90° C is followed by another immersion in deionized water for 10 minutes. A 10% solution of hydrofluoric acid in water is applied to the wafer for one minute and followed by a deionized water bath for 10 minutes.

After the cleaning operation, the wafer is oxidized as shown in FIG. 1 by placing the wafer in an oxygen atmosphere for 5 minutes at 1,050° C. The oxidized wafer is then subjected to a 15 minute treatment with steam followed by a 10 minute application of nitrogen gas. This oxidation step produces a layer 12 of silicon dioxide on silicon layer 11. Typically, an oxide layer 12 of approximately 2700 A is formed by this step.

Subsequently, a layer 13 of a suitable masking material, such as a photoresist, is placed on the oxide layer 12. This masking layer is exposed and developed in a typical manner to form island masks 13A, 13B and 13C when the remainder of layer 13 is removed by a suitable solvent.

After the island masks are formed, the wafer is placed in a 5:1 solution of $NH_4F$:HF at room temperature for a suitable time to remove the unmasked silicon dioxide ($SiO_2$) to the silicon layer. The silicon layer is not attacked by this etchant. The removed portions 12A, 12B, 12C and 12D are indicated by diagonal lines.

After the appropriate areas of the $SiO_2$ have been completely etched through to the upper surface of the silicon layer, the photoresist or mask layer is removed in the standard fashion. Subsequently, the etched wafer is baked for 10 minutes in an atmosphere of gaseous nitrogen at 1,000° C for the purpose of preparing the surface for photoresist adhesion.

Figure 2:
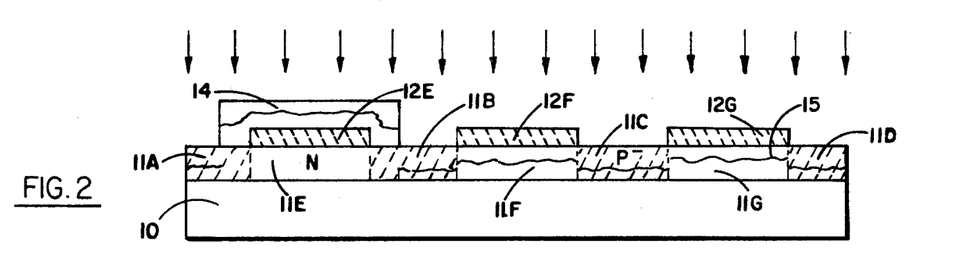

After the bake-out step, another mask 14 (called a P-mask) is applied to the etched wafer as shown in FIG. 2. This mask is of any suitable type, such as photoresist, which is deposited on the previously etched surface of the wafer. The mask material is exposed and developed in a typical fashion so that mask 14 covers only a portion of the wafer. In particular, this mask covers the wafer portions which will ultimately become P-channel devices.

After mask 14 is in place, boron ions (B+) are implanted at 200KeV. The ions (indicated by arrows) are clearly implanted into the exposed portions 11A, 11B, 11C and 11D of silicon layer 11. In addition, ions traverse the oxide layer portions 12F and 12G and are implanted into the silicon under these oxide layers. However, ions do not traverse the mask 14. It may be considered that mask 14 shields the wafer portion thereunder from the ions. In practice, it is understood that the mask is sufficiently thick so as to trap the ions therein which has the net effect of shielding the masked portion of the wafer from such ions.

The ion implantation is conducted until approximately $5 \times 10^{12}$ ions per square centimeter are implanted into the silicon. The silicon layer is, thus, converted to P-type silicon. Typically, it may be considered that the ions traverse a portion of the thickness of the silicon layer as indicated by the wavy line 15. Thereafter, mask 14 is stripped. After mask 14 is removed, the wafer is subjected to a silicon etchant comprising six normal KOH by weight in $H_2O$ plus isopropyl alcohol at 60° ± 5° C. This etchant removes the silicon portions 11A, 11B and 11C and 11D which are indicated by diagonal lines. That is, the silicon which is not shielded by $SiO_2$ is removed.

Next, the wafer is placed in an etchant comprising 5:1 solution of $NH_4F:HF$ of proper temperature and for a suitable time. The remaining silicon dioxide layers are etched and removed to the silicon layer. Consequently, after these etching steps, the wafer comprises a sapphire substrate having areas of silicon thereon. These areas of silicon are identified in FIG. 2 as areas 11E, 11F and 11G. Silicon area 11E remains N-type silicon while areas 11F and 11G have been converted to p-type silicon by the ion implantation.

Figure 3:
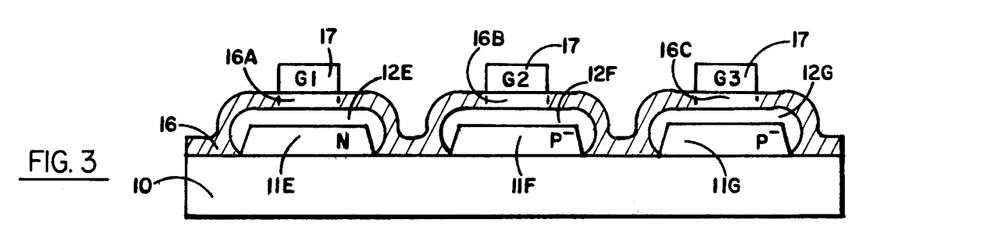

As suggested in FIG. 3, the wafer is reoxidized by placing the wafer in an atmosphere of gaseous oxygen for 30 minutes at 1,050° C. Also, layers 12E, 12F and 12G of oxide on the order of 600± 60 A are grown on the silicon areas 11E, 11F and 11G. It is noted that the oxide is not grown on the sapphire substrate wherein only the silicon islands are effectively encapsulated.

Next, a layer 16 of nitride is deposited on the entire surface of the wafer by using a suitable nitride gaseous source at 950° C. Preferably, the nitride layer will be approximately 750± 75 A in thickness. In order to improve the surface of nitride layer 16 for further activities the wafer is treated with a nitride/steam immersion. That is, the wafer is subjected to steam at approximately 1,000° C for approximately 15 minutes and subsequently to a nitrogen atmosphere for approximately 10 minutes. This prepares the outer surface of nitride layer 16 for application of the next masking layer identified as a G mask 17. Typically, a masking material such as photoresist is applied to the entire surface of the wafer, subsequently exposed and developed, wherein G-masks 17 are provided over each of the island areas of the wafer.

After the masks 17 are in place, the wafer is subjected to a solution comprising $H_3PO_4/HBF_4$ at approximately 108° C for approximately 15 minutes. This etchant has the effect of removing all of the unmasked nitride layer, i.e. the portion of the nitride layer indicated by the diagonal lines. The nitride layer portions 16A, 16B and 16C under the G-masks 17 are not removed. Portions of oxide layer 12E, 12F or 12G are also etched as well although this etching is not essential. After the etching of the nitride layer, masks 17 are removed in the usual fashion.

Figure 4:
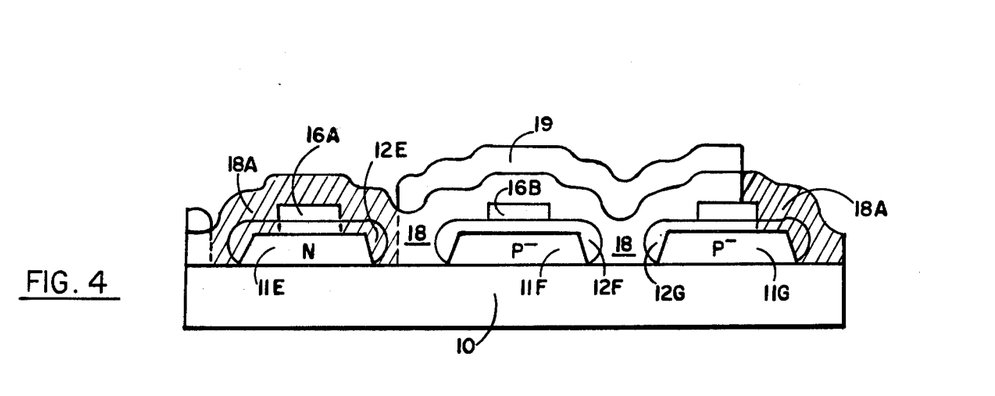

After the masks 17 are removed, the entire wafer is subjected to a silox deposition to produce a silox layer of about 3,000± 500 A thickness. The silox layer 18 is schematically shown in FIG. 4. However, for convenience, the scale thereof is clearly not the same as the scale of the remainder of the wafer. The silox layer is densified by driving the wafer in an oxygen atmosphere for 20 minutes at 1,000° C.

Next, an additional mask 19 (called a P+ mask) is provided. This mask is of any suitable material such as photoresist or the like. When fully exposed and developed, mask 19 covers portions of the wafer wherein the P channel device area is exposed. Again, the wafer is subjected to the 5:1 solution of $NH_4F:HF$ at approximately room temperature for an appropriate amount of time to etch the exposed areas of silox and oxide which areas 18A and portions 12E and 12G are identified by diagonal lines.

Figure 5:
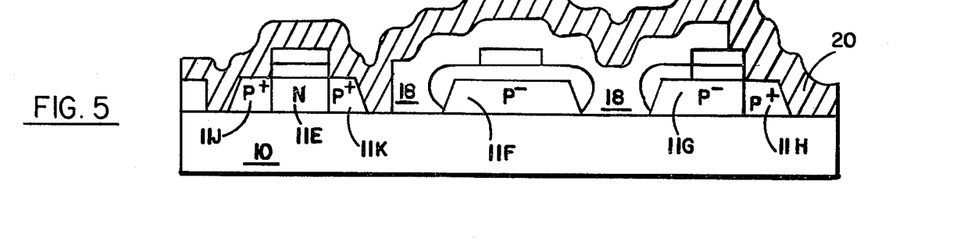

As shown in FIG. 5, after mask 19 is removed, a layer of boron 20 is deposited over the surface of the wafer including the areas from which the silox layer has been removed. During the boron deposition stage, boron is driven into the exposed portions of the silicon islands thereby changing the conductivity type of the affected area to P+.

After the boron deposition has occurred, a deglazing step is effected by applying a 10% solution of HF in $H_2O$ to the wafer for 20 seconds in order to deglaze the wafer and to remove substantially all of the deposit boron glass layer.

The wafer then resembles the configuration shown in FIG. 5 with the areas of the boron layer 20 indicated by diagonal lines removed. The wafer is then subjected to a drive step wherein the wafer is baked for 5 minutes in oxygen at 1,000° C, subjected to steam for 45 minutes and baked in a nitrogen atmosphere for 10 minutes. This step has the effect of driving the boron into the silicon to effect a relatively uniform distribution throughout as well as growing the oxide layer 35 over the boron doped areas as shown in FIG. 6.

Figure 6:
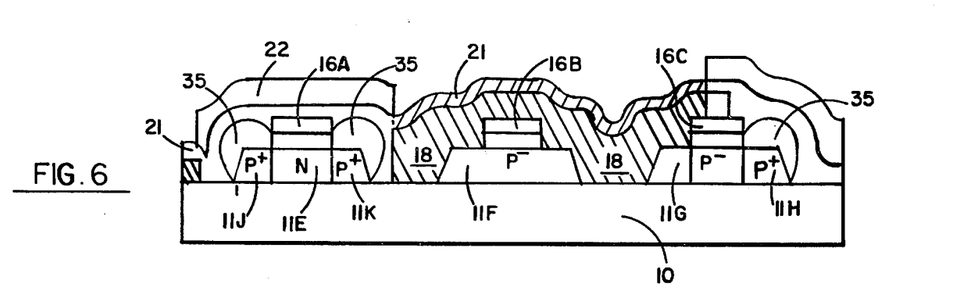

After the oxidation, nitride layer 21 is deposited over the entire surface of the wafer to a thickness of approximately 700± 70 A as shown in FIG. 6. Again, the nitride layer 21 is treated to a nitride steam immersion in order to prepare the surface thereof for the subsequent processing.

During the next masking operation, this silicon nitride layer is left on top of and around al areas which are to be protected during the phosphorous deposition. The silicon nitride layer protects the sapphire and prevents formation of phosphorous-sapphire compounds in the vicinity of the P+ portions of the silicon. In addition, the silicon nitride acts as a diffusion barrier against phosphorous penetration. Thus, p-type areas are protected from the deleterious effects of the phosphorous by effectively sealing same with silicon nitride. Moreover, it is readily observed that this layer is incorporated into the process with no additional masking operations.

Another mask layer 22 which may be a photoresist material is placed over the surface of the nitride layer 21 in a suitable manner. This mask (called a P−/N+ mask) is appropriately exposed and developed so that masks 22 are provided.

Figure 7:
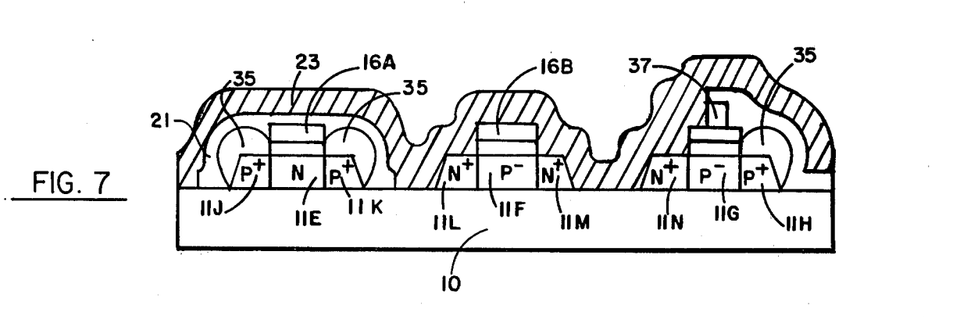

The masked wafer is now subjected to a fluoboric etchant and a silox etchant of the types previously noted wherein the silox and nitride layer portions which are indicated with diagonal lines are removed. That is, after the removal of the nitride layer portions, the exposed portions of silox and oxide over silicon islands 11F and 11G are also removed. The photoresist is removed in a suitable manner. Then, layer 23 of phosphorous is deposited over the entire wafer in a suitable manner as shown in FIG. 7. Layer 23 is provided to supply impurities which are added to the exposed portions of silicon islands 11F and 11G. The affected areas of the silicon islands are converted to N+ type silicon.

The phosphorous layer 23 is then removed from the wafer through an initial removal step using sulfuric acid and amonium persulfate at approximately 105° C to 110° C for 30 minutes. Thereafter, the phosphorous-rich glass layer on the wafer is removed by a deglazing operation which uses, for example, a 10% solution of HF in $H_2O$ for about 20 seconds.

Figure 8:
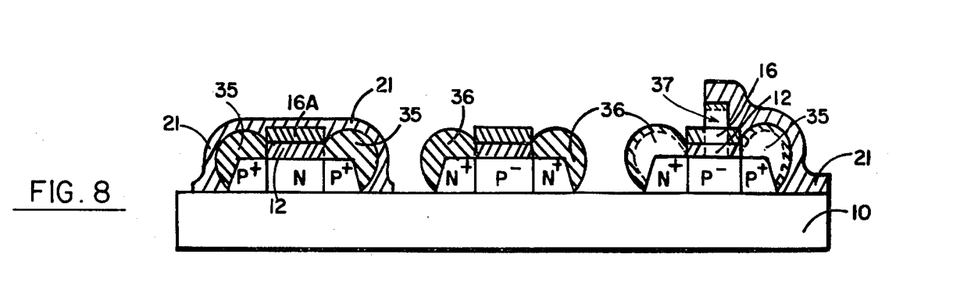

As shown best in FIG. 8, a phosphorous drive step is utilized wherein the impurities of the phosphorous are driven into silicon islands 11F and 11G to produce N+ portions thereof as well as to grow oxide layer 36 over the exposed silicon island portions on the wafer. The oxide layer is typically on the order of 3500± 400 A thick. Thus, a device as shown in FIG. 8 is produced. This device or wafer is subjected to appropriate etching steps which remove nitride layers 21 and 16 indicated by diagonal lines. Likewise, the oxide layer 12 is removed as well. Incidental portions of layers 35 and 36 may also be removed. Basically, the purpose of this etchant step is to remove material which has become contaminated or deteriorated due to other processing.

Figure 9:
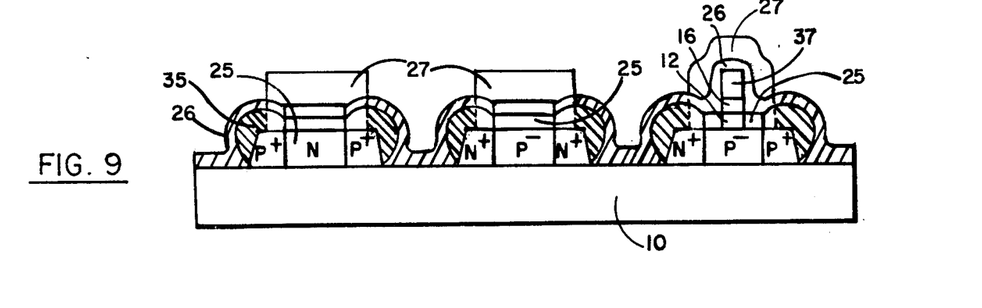

A new oxide layer 25 is produced over the silicon islands. In addition, layers 35 and 36 are also oxidized slightly as shown in FIG. 9. This oxide layer is preferably on the order of 600± 60 A in thickness. A nitride layer 26 of approximately 330± 30 A thickness is then provided over the oxide layer. Again, the nitride layer 26 is subjected to a nitride steam atmosphere in order to permit improved adhesion between the nitride layer 26 and the masking material 27.

Figure 10:
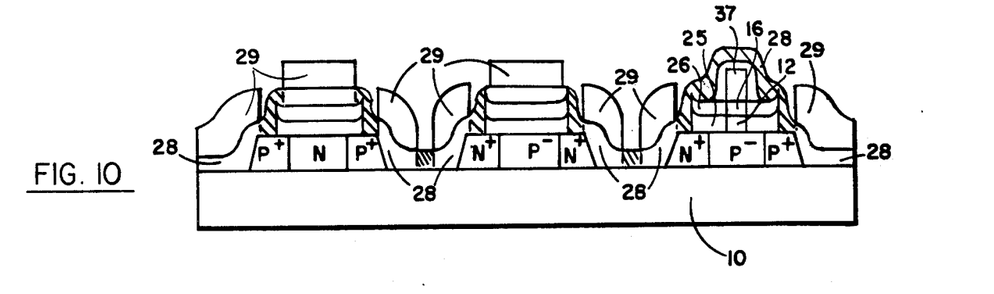

Next, a further mask layer 27 (called C mask) which is of suitable material such as photoresist is placed on layer 26. This masking material is exposed and developed in a conventional manner to produce C masks 27 as shown in FIG. 9. The exposed portions (indicated with diagonal lines) of nitride layer 26 and oxide layer 25 are then etched and completely removed leaving silicon islands with oxide/nitride layers over the channels thereof. Mask 27 is removed in a suitable manner and the entire wafer is metallized in a typical fashion by providing metal layer 28 as shown in FIG. 10. The metallization is accomplished through the use of an E-beam of 10KV to vaporize the metal (e.g. aluminum) and deposit same on the surface of the wafer. The metallization layer is typically 10,000± 1,000 A in thickness and is deposited with the wafers heated to about 300° C.

Incidentally, the remaining portion 37 is a result of accumulated mask tolerances. It must be understood that portion 37 has no ill effect on the completed device. Moreover, if mask tolerances are accurate (ideal), portion 37 will be reduced or even eliminated.

A further mask layer 29 (M mask) is produced over metallization layer 28 in a suitable fashion. Mask 29 is appropriately exposed and developed as shown in FIG. 10. The exposed portions of metal layer 28 indicated by the diagonal lines are removed. Thus, metal electrodes and contacts are established. The entire wafer is then annealed to produce a microalloying of metal to silicon and to remove any radiation damage.

Figure 11:
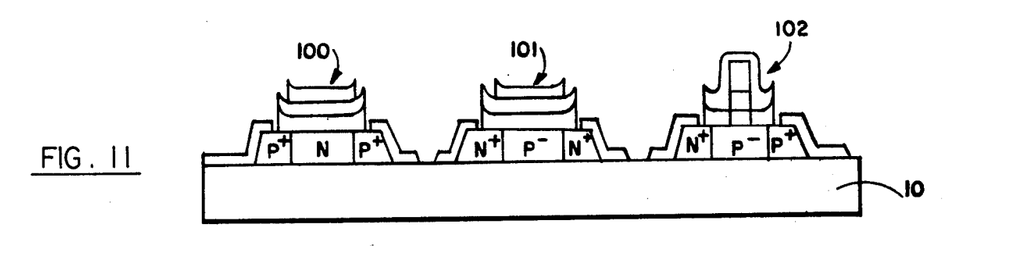

FIG. 11 is a schematic representation of CMOS/SOS device fabricated in accordance with the process of the instant invention. It should be clear that the P-channel and N-channel devices 100 and 101, respectively, are included in a typical CMOS device. In addition, the instant invention provides for the fabrication of diodes 102 in conjunction with the CMOS devices. Diode 102 is frequently useful in fabricating circuit configurations in CMOS applications. However, the fabrication of a diode in the CMOS wafer is not absolutely essential. Consequently, it is possible to omit the P- masking and to make relatively minor changes in the procedures related to diode 102 without minimizing the desirable effects of the process defined herein.

PROCESS B

Process B is considered to be the same as Process A in all but a few minor deviations. Process B is utilized to fabricate CMOS/SOS devices without in situ diodes. The omission of diodes permits the combination or rearrangement of some process steps to permit more efficient operation. However, the substantial similarity of the processes is readily apparent.

Figure 12:
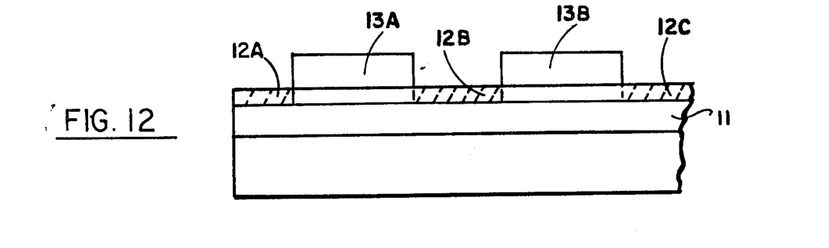
FIGS. 12–21 are schematic representations of other CMOS/SOS devices prepared in accordance with another embodiment of the process of the instant invention.

Reference is made to FIG. 12 which is substantially similar to FIG. 1. For convenience, the right-hand portion of the wafer has been omitted in FIGS. 12–21 since it is superfluous in process B. The composite comprising substrate 10 and layer 2 is also the basic structure or wafer from which composites are made in accordance with Process B. Again, the basic wafer is subjected to a suitable cleaning process as defined supra. After the cleaning operation, the wafer is oxidized as shown in FIG. 12. This oxidation step produces layer 12 of silicon dioxide on silicon layer 11.

Subsequently, masking layer 13 is exposed and developed in a typical manner to form island masks 13A and 13B when the remainder of layer 13 is removed by a suitable solvent.

After the island masks are formed, the wafer is placed in a 5:1 solution of $NH_4F:HF$ at room temperature for a suitable time to remove the unmasked silicon dioxide ($SiO_2$) to the silicon layer. The silicon layer is not attacked by this etchant. The removed portions 12B and 12C and are indicated by diagonal lines.

Figure 13:
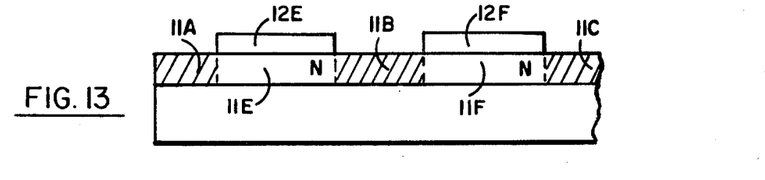

After the appropriate areas of the $SiO_2$ have been completely etched through to the upper surface of the silicon layer, the photoresist or mask layer is removed in the standard fashion. The wafer is then subjected to a silicon etchant (see supra) which removes the unmasked silicon portions 11A, 11B and 11C (as indicated by the dashed lines in FIG. 13.) Next, the wafer is placed in an etchant comprising 5:1 solution of $NH_4F:HF$ of proper temperature and for a suitable time. The remaining silicon dioxide layers are etched and removed to the silicon layer. Consequently, after these etching steps, the wafer comprises a sapphire substrate having areas of silicon thereon. These areas of silicon are identified in FIGS. 13 and 14 as areas 11E and 11F both of which remain N-type silicon.

Figure 14:
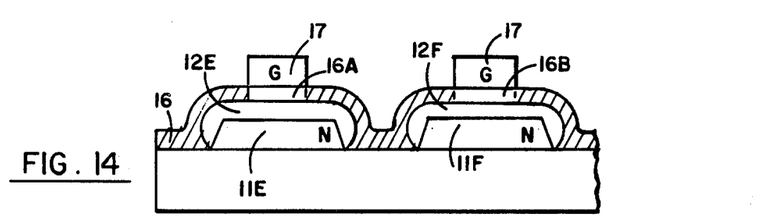

As suggested in FIG. 14, the wafer is reoxidized by placing the wafer in an atmosphere of gaseous oxygen for 30 minutes at 1050° C. Also, layers 12E and 12F of oxide on the order of 600± 60 A are grown on the silicon areas 11E and 11F. It is noted that the oxide is not grown on the sapphire substrate wherein only the silicon islands are effectively encapsulated.

Next, a layer 16 of nitride is deposited on the entire surface of the wafer by using a suitable nitride gaseous source at 950° C. Preferably, the nitride layer will be approximately 750± 75 A in thickness. In order to improve the surface of nitride layer 16 for further activities the wafer is treated with a nitride/steam immersion. That is, the wafer is subjected to steam at approximately 1,000° C for approximately 15 minutes and subsequently to a nitrogen atmosphere for approximately 10 minutes. This prepares the outer surface of nitride layer 16 for application of the next masking layer identified as a G mask 17. Typically, a masking material such as photoresist is applied to the entire surface of the wafer, subsequently exposed and developed, wherein G-masks 17 are provided over each of the island areas of the wafer.

After the masks 17 are in place, the wafer is subjected to a solution comprising $H_3PO_4/HBF_4$ at approximately 108° C for approximately 15 minutes. This etchant has the effect of removing all of the unmasked nitride layer, i.e. the portion of the nitride layer indicated by the diagonal lines. The nitride layer portions 16A and 16B under the G-masks 17 are not removed. During this etch, incidental portions of oxide layers 12E or 12F may be removed as well. After the etching of the nitride layer, masks 17 are removed in the usual fashion.

Figure 15:
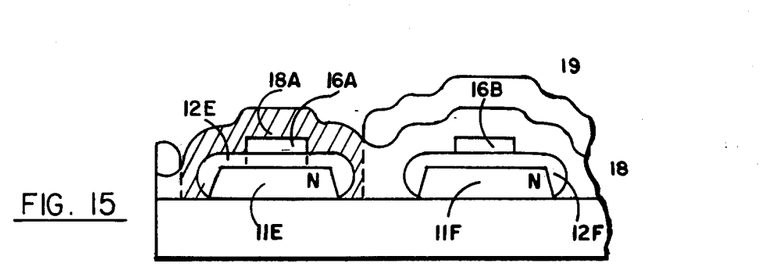

After the masks 17 are removed, the entire wafer receives a silox layer 18 of about 3000± 500 A thickness. The silox layer 18 is schematically shown in FIG. 15. However, for convenience, the scale thereof is clearly not the same as the scale of the remainder of the wafer. The silox layer is densified by driving the wafer in an oxygen atmosphere for 20 minutes at 1000° C.

Next, the P+ mask 19 is provided. This mask is of any suitable material such as photoresist or the like. When fully exposed and developed, mask 19 covers portions of the wafer wherein the P channel device area is exposed. Again, the wafer is subjected to the 5:1 solution of $NH_4F:HF$ at approximately room temperature for an appropriate amount of time to etch the exposed areas of silox and oxide which areas 18A are identified by diagonal lines.

Figure 16:
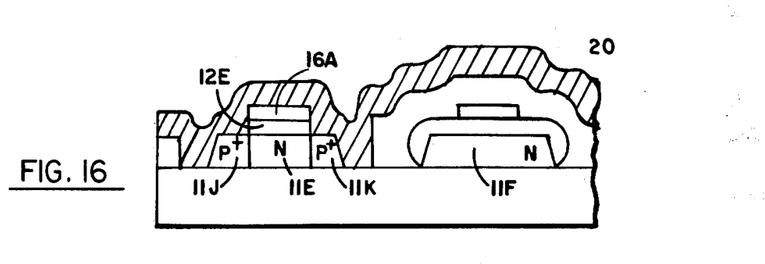

As shown in FIG. 16, after mask 19 is removed, a layer 20 of boron is deposited over the surface of the wafer including the areas from which the silox layer has been removed. During the boron deposition stage, boron is driven into the exposed portions of the silicon islands thereby changing the conductivity type of the affected area to P+. After the boron deposition has occurred, a deglazing step is effected. The wafer then resembles the configuration shown in FIG. 16 with the areas of the boron layer 20 indicated by diagonal lines removed.

The wafer is then subjected to a drive step wherein the wafer is baked for 5 minutes in oxygen at 1000° C, subjected to steam for 45 minutes and baked in a nitrogen atmosphere for 10 minutes. This step has the effect of driving the boron into the silicon to effect a relatively uniform distribution throughout as well as growing the oxide layer 35 over the boron doped areas as shown in FIG. 17.

Figure 17:
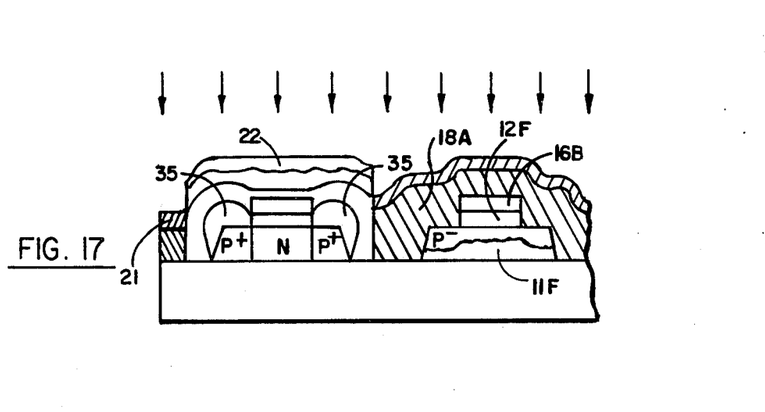

After the oxidation, nitride layer 21 is deposited over the entire surface of the wafer to a thickness of approximately 700± 70 A, as shown in FIG. 17. Again, the nitride layer 21 is treated to a nitride steam immersion in order to prepare the surface thereof for the subsequent processing. This nitride layer has the purpose and advantages noted supra.

Another mask layer 22 which may be a photoresist material is placed over the surface of the nitride layer 21 in a suitable manner. This mask (called a P−/N+ mask) is appropriately exposed and developed so that masks 22 are provided.

The masked wafer is now subjected to a fluoboric etchant and a silox etchant of the types previously noted wherein the silox and nitride layer portions which are indicated with diagonal lines are removed. That is, after the removal of the nitride layer portions, the exposed portions of silox and oxide over silicon islands 11F are also removed. After these etching steps, and with masks 22 in place, boron ions (B+) are implanted at 200 KeV. The ions (indicated by arrows) are implanted into the exposed portions silicon layer 11. In addition, ions traverse the oxide layer portions 12F and are implanted into the silicon under these oxide layers. However, ions do not traverse the mask 22. It may be considered that mask 22 shields the wafer portion thereunder from the ions. In practice, it is understood that the mask is sufficiently thick so as to trap the ions therein which has the net effect of shielding the mask portion of the wafer from such ions.

The ion implantation is continued until approximately $5 \times 10^{12}$ ions per square centimeter are implanted into the silicon. The silicon layer is, thus, converted to P- type silicon. Typically, it may be considered that the ions traverse a portion of the thickness of the silicon layer as indicated by the wavy line 15.

Figure 18:
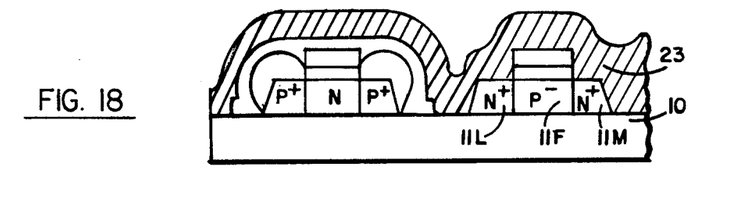

Thereafter, mask 22 is stripped and layer 23 of phosphorous is deposited over the entire wafer in a suitable manner as shown in FIG. 18. Layer 23 is provided to supply impurities which are added to the exposed portions of silicon islands 11F. The affected areas (11L and 11M) of the silicon island are converted to N+ type silicon.

The phosphorous layer 23 is then removed from the wafer through an initial removal step using sulfuric acid and ammonium persulfate at approximately 105° to 110° C for 30 minutes. Thereafter, the phosphorous-rich glass layer on the wafer is removed by a deglazing operation.

Figure 19:
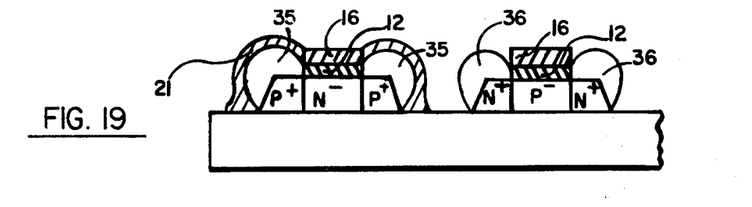

As shown best in FIG. 19, a phosphorous drive step is utilized wherein the phosphorous impurities are driven into silicon island 11F to produce N+ portions thereof as well as to grow oxide layer 36 over the exposed silicon island portions on the wafer. The oxide layer is typically on the order of 3500± 400 A thick. Thus, a device as shown in FIG. 19 is produced. This device or wafer is subjected to appropriate etching steps which remove nitride layers 21 and 16 indicated by diagonal lines. Likewise, the oxide layer 12 is removed as well. Portions of oxide layers 35 and 36 may also be incidentally removed. Basically, the purpose of this etchant step is to remove material which has become contaminated or deteriorated due to other processing.

Figure 20:
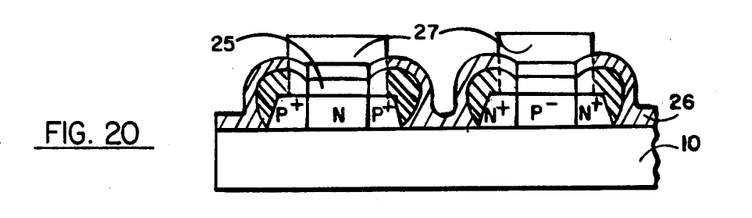

A new oxide layer 25 is produced over the silicon islands (including the channel areas) on the entire wafer as shown in FIG. 20. This oxide layer is preferably on the order of 600± 60 A in thickness. A nitride layer 26 of approximately 330± 30 A thickness is then provided over the oxide layer. Again, the nitride layer 26 is subjected to a nitride steam atmosphere in order to permit improved adhesion between the nitride layer 26 and the masking material 27.

Figure 21:
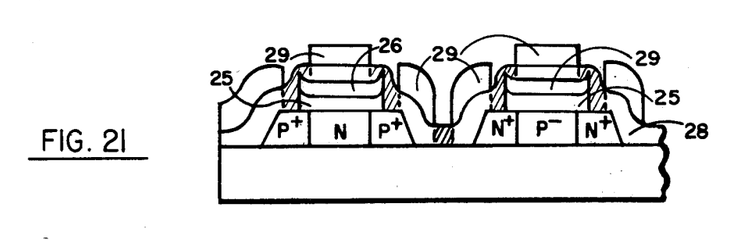

Next, a further mask layer 27 (called C mask) which is of suitable material such as photoresist is placed on layer 26. This masking material is exposed and developed in a conventional manner to produce C masks 27 as shown in FIG. 20. The exposed portions (indicated with diagonal lines) of nitride layer 26 and oxide layer 25 are then etched and completely removed leaving silicon islands with oxide/nitride layers over the channels thereof. Mask 27 is removed in a suitable manner and the entire wafer is metallized in a typical fashion by providing metal layer 28 as shown in FIG. 21. The metallization is accomplished through the use of an E-beam of 10KV to vaporize the metal (e.g. aluminum) and deposit same on the surface of the wafer. The metallization layer is typically 10,000± 1,000 A in thickness and is deposited with the wafers heated to about 300° C.

A further mask layer 29 (M mask) is produced over metallization layer 28 in a suitable fashion. Mask 29 is appropriately exposed and developed as shown in FIG. 21. The exposed portions of metal layer 28 indicated by the diagonal lines are removed. Thus, metal electrodes and contacts are established. The entire wafer is then annealed to produce a microalloying of metal to silicon and to remove any radiation damage.

Figure 22:
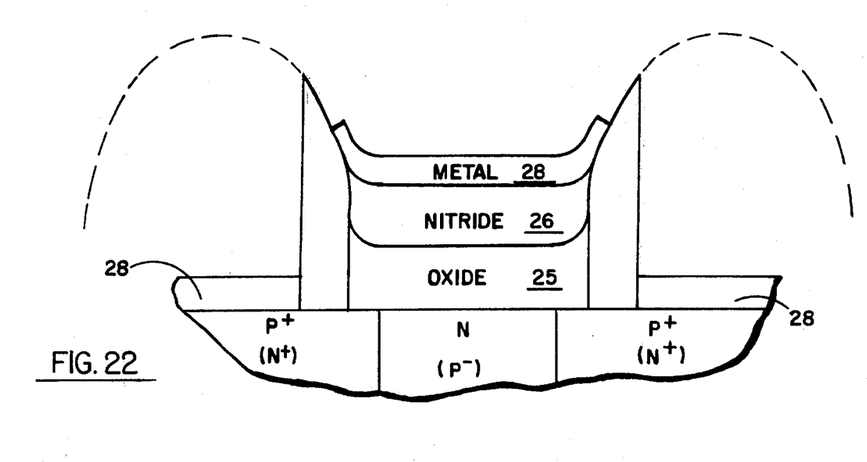
FIG. 22 is an enlarged section of the CMOS/SOS device prepared by the process described herein.

Referring now to FIG. 22, there is shown an enlarged portion of one of the devices produced by the processes described above. A portion of the silicon layer 11 is shown. This layer may be of the P+N–P+ or N+P–N+ type. Either configuration is operable. Over the central or channel region is the gate insulator which comprises layer 25 of oxide and a layer 26 of nitride. The gate electrode 28 is a metal layer. As is indicated in the figures related to the description of the process, it is seen that the outer ends of the oxide layer 25 tend to flare upward from the silicon wherein the ends are thicker than the middle of this layer. The oxide tends to flare due to the formation of the SiO₂ during the oxidation process. The dashed lines indicate the oxide layer formed by oxidation. Inasmuch as oxide layer 25 flares, the layer 26 of nitride supported thereby also flares as does the metal layer of gate electrode 28. This arrangement of the thick oxide over diffused areas provides reduced gate-to-drain overlap capacitance. The same thick oxide over diffused areas also reduces the metal-to-island cross-over capacitance.

Having thus described a preferred embodiment of the invention, it is clear that a process for producing CMOS/SOS devices is provided. With this process, integrated devices using complementary metal oxide semi-conductors with or without additional diodes can be incorporated into the same unit. The process described supra is illustrative only. Certain details of the process may be altered in accordance with specialized requirements and the like. The scope of the invention is defined in the appended claims.

Having thus defined a preferred embodiment of the invention, what is claimed is:

1. A process for making complementary metal-oxide semiconductor devices in silicon sapphire comprising the steps of
   1. providing a wafer comprising a layer of silicon of a first conductivity type on a sapphire substrate;
   2. forming a first silicon oxide layer over the silicon layer;
   3. providing a first mask over said first silicon oxide layer to define regions of the first silicon oxide layer which are to be removed;
   4. removing those portions of the first oxide layer which are not protected by the first mask to expose the silicon thereunder;
   5. removing the first mask;
   6. providing a second mask over the patterned first oxide layer and the exposed silicon to exclude ions which are to be ion implanted from entering the silicon underlying masking portions of the second mask;
   7. ion implanting into the portions of the silicon layer which are not ion-masked by the second mask, conductivity-type-determining ions which induce a second conductivity type in order to convert the ion implanted portions of the silicon from the first conductivity type to the second conductivity type;
   8. removing the second mask;
   9. removing the portions of the silicon which were exposed by steps (4) and (8) to form a plurality of separate silicon islands each having an upper surface protected by those portions of the first silicon oxide layer which were not removed in step (4);
   10. removing any remaining portions of the first silicon oxide layer to expose the upper surface of each of the islands;
   11. thermally growing a second silicon oxide layer on the silicon islands;
   12. depositing a first silicon nitride layer at least over those portions of the second silicon oxide layer which overlie the upper surfaces of silicon islands;
   13. providing a third mask on said wafer to protect selected portions of said first silicon nitride layer which overlie the silicon islands;
   14. removing those portions of the first silicon nitride layer which are left exposed by the third mask;
   15. removing the third mask;
   16. depositing a third silicon oxide layer over the wafer;
   17. providing a fourth mask on the wafer to protect the third silicon oxide layer except for those portions of the third silicon oxide layer which overlie the silicon areas which are to be exposed to a second conductivity type dopant or which are over the area of the sapphire which is adjacent to silicon areas which are to be exposed to the second conductivity type dopant;
   18. removing those portions of the second and third silicon oxide layers which are not protected by the fourth mask;
   19. removing the fourth mask;
   20. depositing a source of a second conductivity type dopant on the wafer;
   21. driving the second conductivity type dopant for a sufficient period of time to insure adequate concentration of second conductivity type dopant in the exposed portions of the silicon islands;

22. removing the source of the second conductivity type dopant;
23. thermally growing a fourth silicon oxide layer;
24. depositing a second silicon nitride layer over the wafer, said second silicon nitride layer covering both those portions of the silicon islands which were exposed to the second conductivity type dopant and the areas of the sapphire adjacent thereto which were exposed to the second conductivity type dopant in order to surround, with the second silicon nitride layer, those portions of the silicon islands which were exposed to the second conductivity type dopant;
25. providing a fifth mask on the wafer to protect said second silicon nitride layer except for those portions of the second silicon nitride layer which overlie those portions of the wafer which are to be exposed to a first conductivity type dopant, the protected portions of the second silicon nitride layer including those portions which cover the sapphire adjacent to, and surround the portions of the silicon islands which were exposed to said source of the second conductivity type dopant in step (20);
26. removing those portions of the second silicon nitride layer and any portions of the second, third and fourth silicon oxide layers which are not protected by the fifth mask;
27. removing the fifth mask;
28. depositing a source of a first conductivity type dopant on the surface of the wafer;
29. driving the first conductivity type dopant for a period of time sufficient to insure an adequate concentration of the first conductivity type dopant in those portions of the silicon which are to be converted from the second conductivity type to first conductivity type;
30. removing the source of the first conductivity type dopant;
31. removing the first and second silicon nitride layers and any remaining portions of the second silicon oxide layer;
32. thermally growing a fifth silicon oxide layer;
33. depositing a third silicon nitride layer over the wafer;
34. providing a sixth mask to protect the third silicon nitride layer except for those portions of the third silicon nitride layer which are to be removed prior to deposition of the metallization which will form contacts to the silicon;
35. removing those portions of the third silicon nitride layer and any silicon oxide which are not protected by the contact mask;
36. removing the sixth mask;
37. depositing a layer of metallization on the wafer to form contacts;
38. providing a seventh mask over the metallized wafer to protect those portions of the metallization which are to be retained; and
39. removing any exposed metallization.

2. The process recited in claim 1 wherein said second conductivity type dopant in step (20) is boron and said first conductivity type dopant in step (28) is phosphorous.

3. A process for making complementary metal-oxide semiconductor devices in silicon-on-sapphire comprising the steps of:

1. providing a wafer comprising a sapphire substrate having thereon a plurality of first silicon islands and a plurality of second silicon islands, said islands being independent, the silicon of said first islands having p-type conductivity and the silicon of said second islands having n-type conductivity;
2. masking selected portions of at least one of said first islands with silox, while exposing selected portions of at least one second island and the surface of the sapphire substrate adjacent to the exposed silicon in preparation for protecting the exposed silicon from undesired counter doping;
3. applying a p-type dopant to the wafer in order to alter the conductivity characteristics of the unmasked portions of said silicon islands;
4. oxidizing said silicon islands in order to drive said first dopant into the silicon to alter the conductivity characteristics of the affected portions of the silicon islands and to form an oxide layer on said silicon islands;
5. protecting the silicon portions the conductivity characteristics of which were altered in steps (3) and (4) from undesired counter doping by preventing subsequent dopant diffusion into the oxide thereover and by preventing dopant induced erosion of the sapphire surface adjacent thereto by applying a nitride layer to said wafer to coat said oxidized islands and the exposed portions of said substrate;
6. masking portions of said nitride layer and etching away the unmasked portions thereof as well as the portions of the oxide layer under the unmasked portions of the nitride layer, while leaving intact the nitride layer over said silicon portions the conductivity characteristics of which were altered in steps (3) and (4) and the adjacent portions of the sapphire substrate, but exposing portions of the silicon the conductivity characteristics of which it is desired to alter;
7. applying a phosphorous dopant to said wafer in order to alter the conductivity characteristics of the exposed portions of said silicon;
8. oxidizing said silicon islands in order to drive said phosphorous into the silicon to alter the conductivity characteristics of the exposed portions of the silicon and to form an oxide layer on said silicon islands;
9. selectively masking and etching portions of the oxide layer to expose portions of the silicon islands; and
10. applying conductors to the exposed portions of said silicon islands to function as contacts thereat.

4. The process recited in claim 3 wherein said p-type dopant is boron.

5. The process recited in claim 3 including the step of deglazing the wafer to remove excess dopant from the wafer prior to the oxidizing steps (4) and (8).

6. The process recited in claim 3 wherein step (1) comprises:

a. providing a wafer comprising a layer of silicon of a first conductivity type on a sapphire substrate;
b. providing an island mask over the silicon wherein the portions of the silicon which are to be retained as silicon islands are protected by the island mask;
c. converting selected portions of the silicon to a second conductivity type by ion implantation masking the silicon which is not to be converted to the second conductivity type and ion implanting into the portions of the silicon the conductivity type of which is to be converted conductivity-type-determining ions which induce a second conductivity type;

d. removing the portions of the silicon which are not masked by the island mask to form a plurality of separate silicon islands each having an upper surface protected by a masking portion of the island mask; and e. removing said island mask.

7. The process recited in claim 6 wherein step (b) comprises:

oxidizing said layer of silicon on said sapphire substrate to form an oxide layer on said silicon layer; and masking and etching portions of the oxide layer formed on said silicon layer to form regions of oxide over said silicon layer, said regions of oxide comprising the masking portions of said island mask.

* * * * *